(12) United States Patent
Manabe et al.

(10) Patent No.: US 9,315,026 B2
(45) Date of Patent: Apr. 19, 2016

(54) METHOD FOR MANUFACTURING LIQUID DISCHARGE HEAD

(71) Applicant: CANON KABUSHIKI KAISHA, Tokyo (JP)

(72) Inventors: Takanobu Manabe, Kawasaki (JP); Yoshinori Tagawa, Yokohama (JP); Hiroyuki Murayama, Yokohama (JP); Shuhei Oya, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/824,954

(22) Filed: Aug. 12, 2015

(65) Prior Publication Data
US 2016/0052273 A1 Feb. 25, 2016

(30) Foreign Application Priority Data
Aug. 19, 2014 (JP) ................. 2014-166394

(51) Int. Cl.
*B41J 2/16* (2006.01)
*G03F 7/20* (2006.01)

(52) U.S. Cl.
CPC ................. *B41J 2/1631* (2013.01); *B41J 2/162* (2013.01); *G03F 7/2022* (2013.01)

(58) Field of Classification Search
CPC ..... G03F 7/20; G03F 7/2002; G03F 7/70425; G03F 7/70458; G03F 7/70466; B41J 2/1631
USPC .................................. 430/320, 396
See application file for complete search history.

(56) References Cited

U.S. PATENT DOCUMENTS

| | | | |
|---|---|---|---|
| 2013/0149648 A1* | 6/2013 | Manabe | G03F 7/20 430/320 |
| 2013/0152391 A1* | 6/2013 | Ishimatsu | B41J 2/1621 29/890.1 |
| 2014/0293259 A1* | 10/2014 | Manabe | G03F 7/0015 355/77 |

FOREIGN PATENT DOCUMENTS

JP    2009-166492 A    7/2009

* cited by examiner

*Primary Examiner* — John A McPherson
(74) *Attorney, Agent, or Firm* — Canon USA Inc. IP Division

(57) ABSTRACT

A method for manufacturing a liquid discharge head. The method includes a first step of forming a telecentric measurement pattern A by exposure, the telecentric measurement pattern A being part of a measurement pattern that allows determination of inclination of a principal ray caused by an off-axis telecentric degree occurring in a projection exposing device, and a second step of forming a telecentric measurement pattern B by exposure under an exposure condition defocused from an exposure condition in the first step, the telecentric measurement pattern B being another part of the measurement pattern, which allows the determination of the inclination of the principal ray caused by the off-axis telecentric degree occurring in the projection exposing device. The off-axis telecentric degree is determined from an amount of misalignment between relative forming positions of the telecentric measurement patterns A and B and an amount of defocusing.

11 Claims, 8 Drawing Sheets

METHOD FOR MANUFACTURING LIQUID DISCHARGE HEAD

BACKGROUND OF THE INVENTION

1. Field of the Invention

The present invention relates a method for manufacturing a liquid discharge head.

2. Description of the Related Art

One example of a liquid discharge head that discharges liquid through discharge ports is an inkjet recording head that records information on a record medium, such as paper, by discharging ink thereto. One example method for manufacturing a liquid discharge head is a method described in Japanese Patent Laid-Open No. 2009-166492. First, a substrate including energy generating elements that generate energy for discharging liquid through discharge ports is prepared. Then, a positive photosensitive resin layer containing a light absorbing agent is formed on the substrate. Subsequently, the positive photosensitive resin layer is exposed and developed, and a channel pattern having a channel shape is formed. Then, a photosensitive layer that is to be a discharge port forming member is formed so as to cover the channel pattern. The photosensitive layer is exposed and developed with an i line (wavelength 365 nm), and the discharge ports are formed. After that, the channel is formed by removal of the channel pattern.

SUMMARY OF THE INVENTION

A method for manufacturing a liquid discharge head according to the present invention includes a step of forming a discharge port pattern at a layer containing a photosensitive resin material by exposure using a projection exposing device. The method includes a first step of forming a telecentric measurement pattern A by exposure through a mask, the telecentric measurement pattern A being part of a measurement pattern that allows determination of inclination of a principal ray caused by an off-axis telecentric degree occurring in the projection exposing device, and a second step of forming a telecentric measurement pattern B by exposure through a mask under an exposure condition defocused from an exposure condition in the first step, the telecentric measurement pattern B being another part of the measurement pattern, which allows the determination of the inclination of the principal ray caused by the off-axis telecentric degree occurring in the projection exposing device. The off-axis telecentric degree is determined from an amount of misalignment between relative forming positions of the telecentric measurement pattern A and the telecentric measurement pattern B and an amount of defocusing.

A method for manufacturing an inkjet print head according to the present invention is a method for manufacturing an inkjet print head including a plurality of liquid discharge heads. The method includes a step of manufacturing the plurality of liquid discharge heads by the method according to the present invention and a step of selecting liquid discharge heads having the determined off-axis telecentric degrees close to each other.

Further features of the present invention will become apparent from the following description of exemplary embodiments with reference to the attached drawings.

DESCRIPTION OF THE EMBODIMENTS

Figure 1:
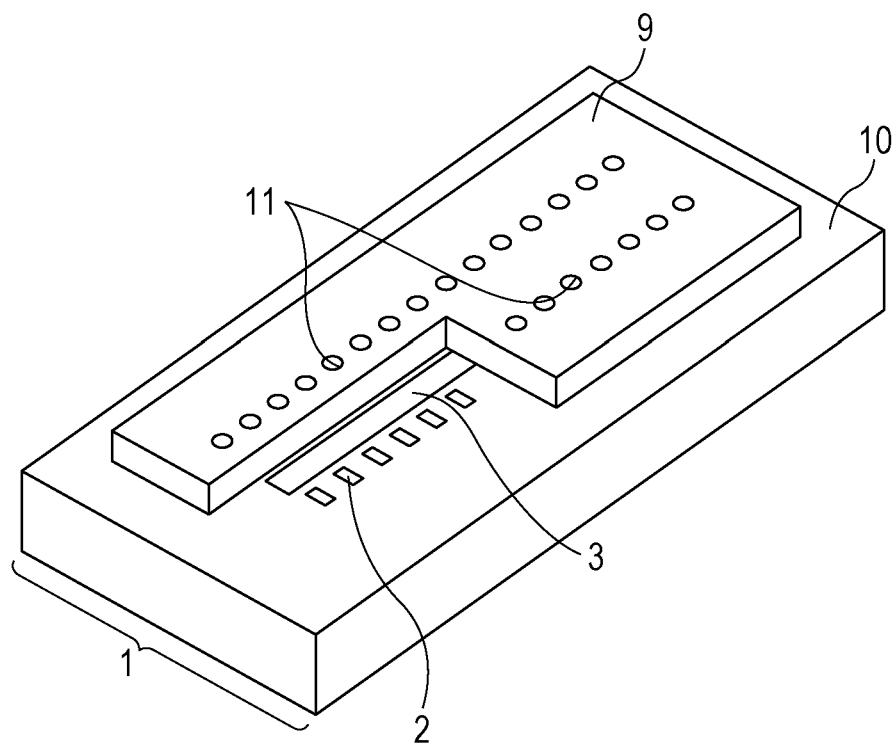
FIG. 1 is a schematic perspective view that illustrates an example of a liquid discharge head manufactured by a method according to the present invention.

The method described in Japanese Patent Laid-Open No. 2009-166492 can use reduction projection exposure in performing exposure on a photosensitive layer that is to be a discharge port forming member. In that case, the inventors of the present invention discovered that liquid discharged through a discharge port in the vicinity of a circumference of an exposure area deviated from an ideal landing position and this resulted in a decrease in a recording quality in recording (e.g., printing). The inventors analyzed its cause and found that when reduction projection exposure is performed, the inclination of a principal ray with respect to a light axis in the vicinity of an end portion in the exposure area was larger than that in a central portion in the exposure area. Thus in the strict sense, the inclination of the principal ray with respect to the light axis for exposing each discharge port slightly varies. From the viewpoint of the effects of that difference on the printing quality, the determination of the inclination of the principal ray for forming a discharge port in the liquid discharge head with respect to the light axis leads to improvement and stabilization of the printing quality.

The inclination of the principal ray with respect to the light axis can be determined by actually printing by an inkjet print head including the obtained liquid discharge head. However, this way needs manufacturing the inkjet print head up to a form at which printing can be performed. If the result of printing shows that the printing quality does not meet the standards, the head may not be able to be shipped as a product. To address this issue, there is a need to determine the inclination of the principal ray with respect to the light axis at the earliest possible stage.

One approach to determining the effects on recording at a stage of manufacturing the liquid discharge head can be formation of a pattern that allows determination of the inclination of the principal ray with respect to the light axis (hereinafter referred to as "telecentric measurement pattern") in the vicinity of a discharge port forming position at the time of forming the discharge port. In addition, by ranking the degrees of the inclinations of the principal rays with respect to the light axis for the liquid discharge heads by using a fixed value, the manufacture of the inkjet print head can receive feedback. For example, for an inkjet print head including a plurality of liquid discharge heads, selecting liquid discharge heads of similar ranks and using them in the manufacture of the inkjet print head can be estimated to lead to improvement and stabilization of the printing quality in the inkjet print head as a whole.

The present invention can provide a liquid discharge head that allows determination of the amount of landing position deviation of liquid in recording.

A method for manufacturing a liquid discharge head according to the present invention includes a step of forming a discharge port pattern at a layer containing a photosensitive resin material by exposure using a projection exposing device. The method includes a first step of forming a telecentric measurement pattern A by exposure through a mask, the telecentric measurement pattern A being part of a measurement pattern that allows determination of inclination of a principal ray caused by an off-axis telecentric degree occurring in the projection exposing device and a second step of forming a telecentric measurement pattern B by exposure through a mask under an exposure condition defocused from an exposure condition in the first step, the telecentric measurement pattern B being another part of the measurement pattern, which allows the determination of the inclination of the principal ray caused by the off-axis telecentric degree occurring in the projection exposing device. The off-axis telecentric degree is determined from an amount of misalignment between relative forming positions of the telecentric measurement pattern A and the telecentric measurement pattern B and an amount of defocusing.

A method for manufacturing an inkjet print head according to the present invention is a method for manufacturing an inkjet print head including a plurality of liquid discharge heads. The method includes a step of manufacturing the plurality of liquid discharge heads by the method according to the present invention and a step of selecting liquid discharge heads having the determined off-axis telecentric degrees close to each other.

As previously described, the inventors of the present invention discovered that in reduction projection exposure, the position where a ray passes through an exposure pattern formed on a mask had an effect on the amount of landing position deviation of liquid discharged through a discharge port. This respect is described in detail below.

Figure 2:
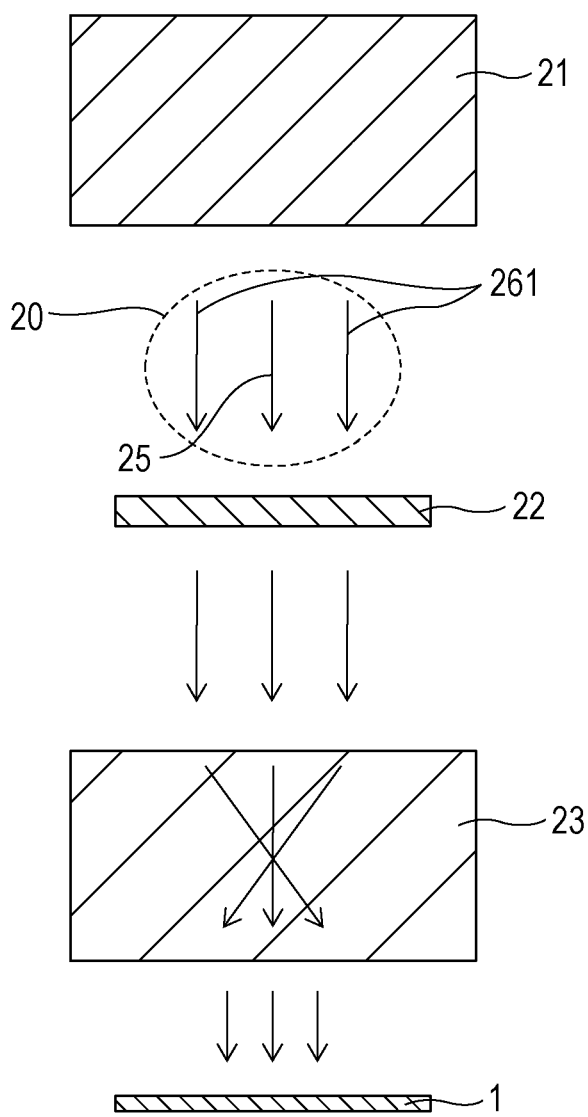
FIG. 2 is a schematic cross-sectional view that illustrates how a projection exposing device performs reduction projection exposure.

FIG. 2 illustrates how a projection exposing device performs reduction projection exposure. The projection exposing device includes an illuminating optical system 21 configured to emit a pencil of rays 20 from a light source toward a mask 22 and a reduction projection optical system 23 configured to project a reduced light-transmitting pattern (exposure pattern) formed on the mask 22 to a layer containing a photosensitive resin material. When the center of the pencil of rays 20 emitted from the illuminating optical system 21 and the center of the mask 22 are coaxial with each other, rays 261 emitted to the circumferential portion of the mask 22 are incident on the front surface of a liquid discharge head 1 at angles greater than an angle at which a ray 25 emitted to the center of the mask 22 is incident. That is, even when the ray 25 emitted to the center of the mask 22 is incident on the front surface of the liquid discharge head 1 perpendicularly, each of the rays 261 emitted to the circumferential portion of the mask 22 is slightly inclined with respect to a direction perpendicular to the front surface of the liquid discharge head 1.

A ray passing through the exposure pattern arranged in the vicinity of the circumferential portion of the mask 22, of the exposure pattern formed on the mask 22, is projected to the liquid discharge head 1 at a predetermined inclination, and thus a discharge port formed on the liquid discharge head 1 is also inclined. Droplets discharged through the inclined discharge port land in a location deviating from an ideal landing position on a record medium. With a method for manufacturing a liquid discharge head according to the present invention, the deviation from the ideal landing position can be determined in advance.

FIG. 1 is a schematic view that illustrates one example of a liquid discharge head manufactured by a method according to the present invention. The liquid discharge head 1 illustrated in FIG. 1 includes a substrate 10 on which energy generating elements 2 configured to generate energy for discharging liquid are aligned in two rows at a predetermined pitch. The substrate 10 includes a supply portion 3 configured to supply liquid. The supply portion 3 is open between the two rows of the energy generating elements 2. Discharge ports 11 corresponding to the energy generating elements 2 and a channel (not illustrated) communicating with the discharge ports 11 from the supply portion 3 formed in a discharge port forming member 9 are disposed on the substrate 10.

As described above, the discharge port forming member 9 also functions as a member for forming part of the channel. Thus a material contained in the discharge port forming member 9 needs high mechanical strength, adhesion with the background, resistance to ink, and additionally, resolution for patterning fine patterns of the discharge ports 11. Examples of the material achieving such properties may include epoxy resin of the cationic polymerization type. Examples of that epoxy resin may include a reaction product of bisphenol A and epichlorohydrin, a reaction product of bromo bisphenol A and epichlorohydrin, and a reaction product of phenol novolak or o-cresol novolak and epichlorohydrin. The epoxy equivalent of the epoxy resin may preferably be 2000 or less, and may further preferably be 1000 or less. When the epoxy equivalent is not greater than 2000, the crosslink density does not decrease during a curing reaction of the epoxy resin, and adhesion and resistance to ink improve.

An example of a photocationic polymerization initiator for curing the above-described epoxy resin may be a compound that generates acid in response to light irradiation. Examples of such a compound may include aromatic sulfonium compound and aromatic iodonium compound. A wavelength sensitizer may be added if needed. One example of the wavelength sensitizer may be SP-100 (trade name) commercially available from ADEKA Corporation.

The liquid discharge head 1 illustrated in FIG. 1 is arranged such that a first surface with the discharge ports 11 disposed therein faces a recording surface of a record medium. Application of energy generated by the energy generating elements 2 on liquid (e.g., ink) filled in the channel through the supply portion 3 causes droplets to be discharged through the discharge ports 11. By attaching the droplets to the record medium, information is recorded thereon.

Next, the projection exposing device is described with reference again to FIG. 2. Of rays emitted from, for example, a high-pressure mercury-vapor lamp, i lines may be used in exposure. The exposure is not limited to such rays. Any ray having a wavelength at which a member to be patterned can be exposed may be used.

When the focus position is moved from a best focus position to a defocus position in the reduction projection optical system, distortion (defocus distortion) may occur. The magnitude of the distortion varies depending on the degree of defocusing. In the present invention, the magnitude of the defocus distortion is defined as "off-axis telecentric degree." The telecentric property indicates parallelism of a principal ray with respect to a light axis of the optical system.

The absolute value of an off-axis telecentric degree of a ray on an outer side of a pencil of rays tends to be larger than that of a ray at the center of the pencil of rays. The center of the pencil of rays means the center of gravity of the pencil of rays in a cross section parallel with the mask. When the center of the pencil of rays coincides with (is coaxial with) the center of the mask, the absolute value of the off-axis telecentric degree of the ray 261 emitted to the circumferential portion of the mask 22 is larger than that of the ray 25 emitted to the center of the mask 22. The center of the mask 22 basically coincides with the light axis of the reduction projection optical system 23, and thus the same applies to the relation with the light axis of the reduction projection optical system 23. Because of the effect of the off-axis telecentric degree, the pencil of rays 20 emitted from the illuminating optical system 21 to the mask 22 is inclined with respect to a direction perpendicular to the front surface of the liquid discharge head 1. When the slope angle of this ray is $\phi1$, a change in an image formation position made by distortion caused by defocusing of 1 μm can be expressed as $1000 \times \tan \phi1$ (nm). Typically, the change in the image formation position is on the order of "nm" and thus the slope angle $\phi1$ is significantly small, and $\tan \phi1$ can be considered approximately equal to $\sin \phi1$.

Figure 3A:
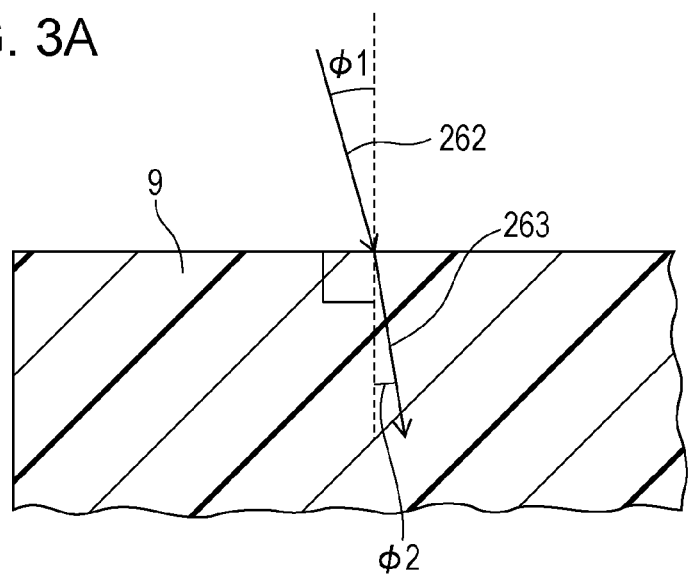
FIGS. 3A and 3B are schematic cross-sectional views that illustrate a ray and inclination of a discharge port in reduction projection exposure.

As illustrated in FIG. 3A, when a ray 262 of the slope angle (angle of incidence) $\phi1$ is emitted to the discharge port forming member 9 on the substrate, a slope angle $\phi2$ of a discharge port patterned can be expressed as being approximately equal to $\phi1/n$, where n indicates a refractive index of the photosensitive resin material contained in the discharge port forming member 9 and the refractive index of the air is 1.

Figure 3B:
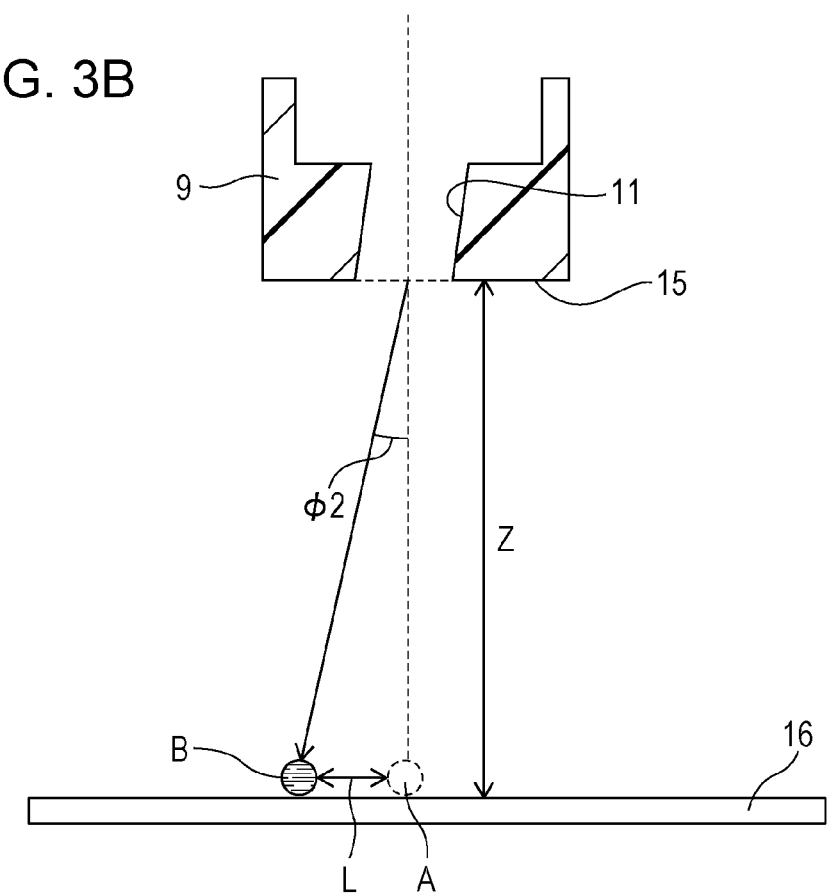

As illustrated in FIG. 3B, droplets discharged through the discharge port 11 formed by a ray 263 of the slope angle $\phi2$ are inclined with respect to a direction perpendicular to a first surface 15 being the front surface of the discharge port forming member 9 because of the slope angle $\phi2$ of the discharge port 11. Accordingly, the liquid lands in a location (actual landing position B) deviating from an ideal landing position A on a record medium 16. When the distance from the first surface 15 to the record medium 16 is Z, the amount L of landing position deviation is $Z \tan \phi2$.

An example of a procedure for manufacturing the liquid discharge head in the present invention is described below. First, a substrate including energy generating elements configured to generate energy required for discharging liquid through discharge ports is prepared. Then, a layer containing a photosensitive resin containing a light absorbing agent is formed on the substrate. Subsequently, the layer containing the photosensitive resin is exposed by photolithography, and a pattern having a channel shape is formed. Then, a layer that contains a photosensitive resin material and that is to be a discharge port forming member is formed so as to cover the pattern. The photosensitive resin material may be negative or positive.

Then, the layer containing the photosensitive resin material is subjected to reduction projection exposure by using the above-described projection exposing device through a mask with a light-transmitting pattern formed thereon. The light-transmitting pattern formed on the mask corresponds to a discharge port pattern to be formed on the layer containing the photosensitive resin material. Here, a light-transmitting pattern for use in telecentric measurement pattern may be formed on the mask. The light-transmitting pattern for the telecentric measurement pattern may be formed on a mask different from the above-described mask, and the mask may be subjected to another reduction projection exposure. Subsequently, the discharge port pattern and the telecentric measurement pattern each corresponding to the light-transmitting pattern at the mask are formed on the layer containing the photosensitive resin material by development. After that, the channel pattern is removed through the discharge ports, and the channel is formed in the discharge port forming member.

Figure 4A:
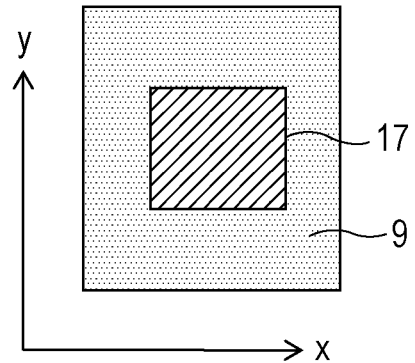
FIGS. 4A to 4C are schematic top views that illustrate an example of a method for forming a telecentric measurement pattern.
Figure 4B:
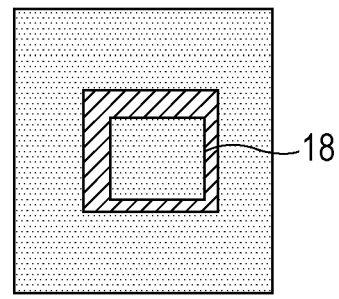
Figure 4C:
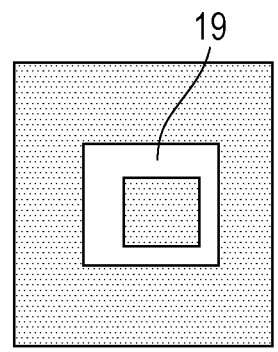

Next, an example of a process for manufacturing the telecentric measurement pattern in the present invention is described. FIGS. 4A to 4C are schematic top views that illustrate one example of a method for forming the telecentric measurement pattern at the discharge port forming member 9. As illustrated in FIG. 4A, a pattern that is to be a telecentric measurement pattern outer frame 17 (hereinafter referred to as "telecentric measurement pattern A") is formed on a first surface of the discharge port forming member 9 by reduction projection exposure. For convenience, an x direction and a y direction are set as illustrated in FIG. 4A. The photosensitive resin material forming the discharge port forming member 9 may be negative or positive, as previously described, and a case where it is negative is discussed below. In FIG. 4A, an area surrounded by the telecentric measurement pattern outer frame 17 is an unexposed area. That is, the telecentric measurement pattern A is formed in the unexposed area. Then, as illustrated in FIG. 4B, a pattern that is to be a telecentric measurement pattern inner frame 18 (hereinafter referred to as "telecentric measurement pattern B") is formed inside the previously formed telecentric measurement pattern A. In FIG. 4B, an area surrounded by the telecentric measurement pattern inner frame 18 is an exposed area. That is, the telecentric measurement pattern B is formed in the exposed area. At this time, the telecentric measurement pattern B is formed after defocusing from a focus value at which the telecentric measurement pattern A is formed. The shape of the telecentric measurement pattern B formed on the mask may be similar to the shape of the telecentric measurement pattern A formed on the mask. The positions of the patterns are set such that the center position of gravity of the telecentric measurement pattern A formed on the mask coincides with that of the telecentric measurement pattern B formed on the mask. However, when an off-axis telecentric situation occurs, the patterns are formed such that the centers of gravities of both patterns are misaligned on the front surface, as illustrated in FIG. 4B. The reason will be described with reference to FIGS. 5A to 5C. After that, as illustrated in FIG. 4C, the unexposed area between the telecentric measurement pattern A and the telecentric measurement pattern B is removed by development, and a telecentric measurement pattern 19 is formed.

Figure 5A:
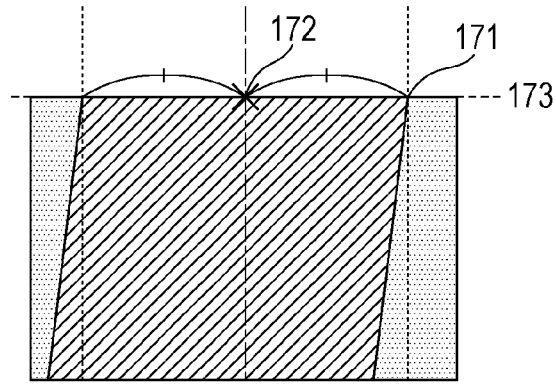
FIGS. 5A to 5C are schematic cross-sectional views that illustrate an example of a method for forming a telecentric measurement pattern and a principle of measurement of an off-axis telecentric degree.
Figure 5B:
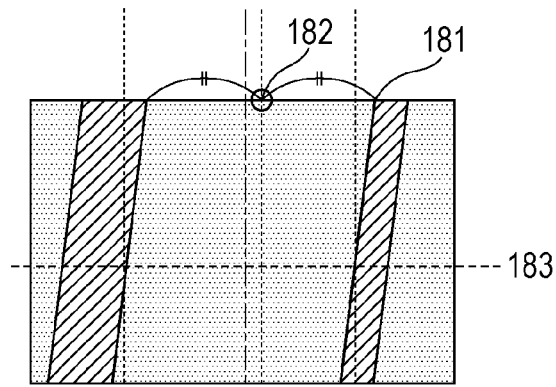
Figure 5C:
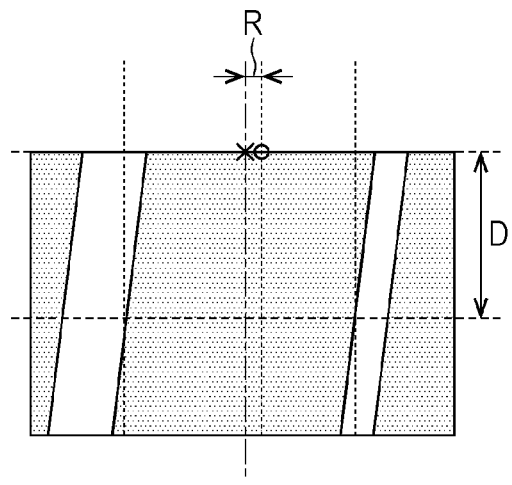

Next, a process for manufacturing the telecentric measurement pattern and a principle of measurement of the off-axis telecentric degree in the present invention are described below. FIGS. 5A to 5C are schematic cross-sectional views that illustrate a case where the telecentric measurement pattern is formed on the first surface of the layer 9 containing the photosensitive resin material and correspond to cross sections in the x direction in FIGS. 4A to 4C, respectively. When the exposure in the projection exposing device has an off-axis telecentric degree, as illustrated in FIG. 5A, the telecentric measurement pattern A (unexposed area) is formed at an inclination with respect to the light axis. An end portion 171 of the outer frame pattern and a midpoint position 172 of the outer frame pattern at this time are illustrated in FIG. 5A. A focus position 173 can be set at any location. Here, the focus position 173 (top reference) is set at the first surface of the layer containing the photosensitive resin material. Next, as illustrated in FIG. 5B, the telecentric measurement pattern B is formed. An end portion 181 of the inner frame pattern and a midpoint position 182 of the inner frame pattern at this time are illustrated in FIG. 5B. The telecentric measurement pattern B is formed such that the focus position 173 at which the telecentric measurement pattern A is formed is defocused (defocus position 183). Thus, the center position of gravity of the telecentric measurement pattern A at its focus position and that of the telecentric measurement pattern B at its focus position coincide with each other. In contrast, there is misalignment between the center position of gravity of the telecentric measurement pattern A and that of the telecentric measurement pattern B at the focus position 173, which is the focus position of the telecentric measurement pattern A, by the amount corresponding to the off-axis telecentric degree. Then, as illustrated in FIG. 5C, the telecentric measurement pattern is formed by development. Here, the off-axis telecentric degree is calculated from an amount R of the misalignment between the center position of gravity of the telecentric measurement pattern A and that of the telecentric measurement pattern B and an amount D of defocusing. The off-axis telecentric degree can be obtained by using the thought illustrated in FIGS. 3A and 3B, which is previously described. Specifically, the off-axis telecentric degree is R/D. The amount R of the misalignment of the center position of gravity can be calculated from, for example, the midpoint of each of the telecentric measurement pattern A and the telecentric measurement pattern B by detecting the edges thereof. One example of a method for detecting the edges may be an optical technique utilizing light reflection or the like. In the case illustrated in FIGS. 5A to 5C, the measurement in the x direction is discussed. The off-axis telecentric degree in the y direction can also be measured by using the same thought.

Embodiments of a method according to the present invention are described below. The present invention is not limited to the embodiments, and various changes and deformations can be made without departing from the spirit and scope of the present invention. Steps relating to formation of the telecentric measurement pattern and the discharge ports are illustrated in the embodiments. The above-described steps are applicable to other steps.

First Embodiment

Figure 6A:
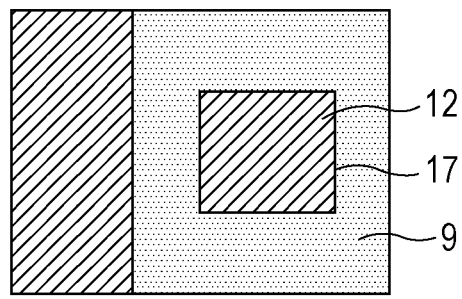
FIGS. 6A to 6C are schematic top views that illustrate steps of forming a telecentric measurement pattern and discharge ports according to a first embodiment.
Figure 6B:
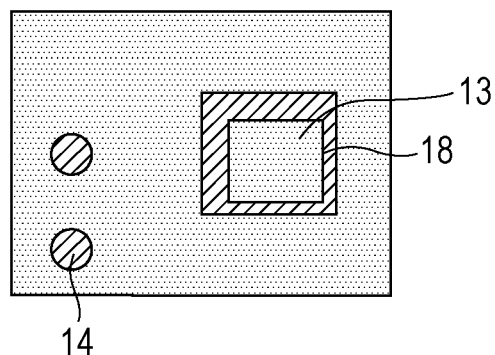
Figure 6C:
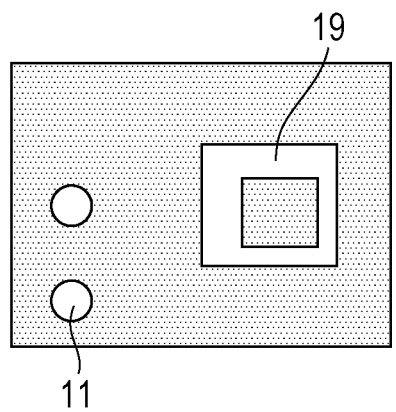
Figure 7A:
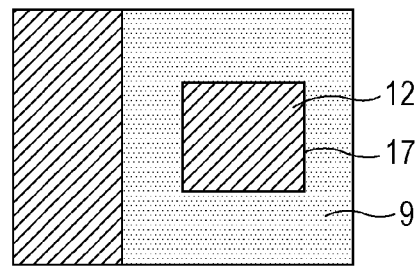
FIGS. 7A to 7D are schematic top views that illustrate steps of forming a telecentric measurement pattern and discharge ports according to a second embodiment.
Figure 7B:
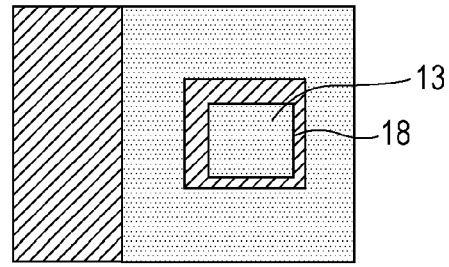
Figure 7C:
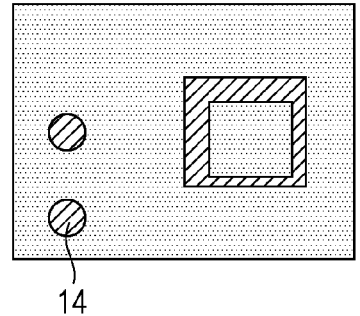
Figure 7D:
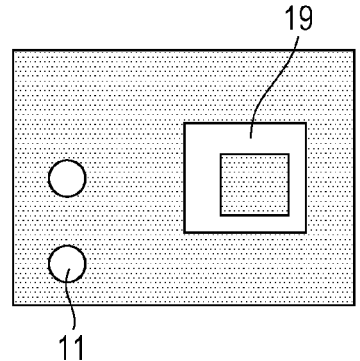
Figure 8A:
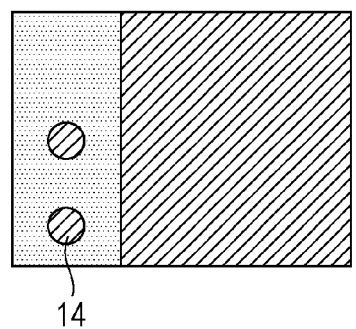
FIGS. 8A to 8D are schematic top views that illustrate steps of forming a telecentric measurement pattern and discharge ports according to a third embodiment.
Figure 8B:
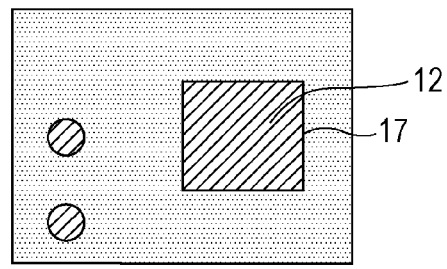
Figure 8C:
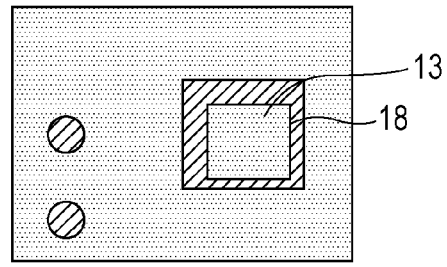
Figure 8D:
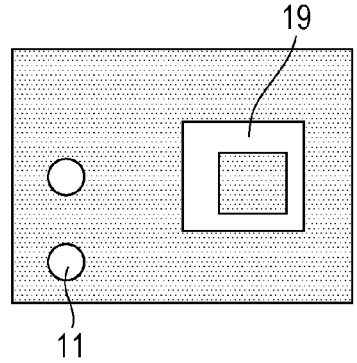

An embodiment in which the telecentric measurement pattern and the discharge port pattern are formed simultaneously in reduction projection exposure is described as one embodiment in the present invention with reference to FIGS. 6A to 6C. In the present embodiment, part of the steps of forming the telecentric measurement pattern and the discharge port pattern can be omitted, and there are advantages of reducing the cost and shortening the tact time required for the manufacture. In addition, the adverse effects brought by variation in apparatus, such as nonuniformity in exposure dose and illuminance over time, can also be reduced. Accordingly, the off-axis telecentric degree can be determined more correctly.

First, as illustrated in FIG. 6A, a telecentric measurement pattern A 12 defining the telecentric measurement pattern outer frame 17 is formed in the vicinity of the discharge port forming positions in the layer 9 containing the photosensitive resin material by exposure using the projection exposing device. When negative photosensitive resin is used as the material of the layer 9 containing the photosensitive resin material, an area where the discharge ports to be formed is shielded from light. The area shielded from light varies depending on the size of the discharge port, illumination conditions (e.g., numerical aperture, aperture amount), exposure dose, photosensitivity of the layer 9 containing the photosensitive resin material, and the like. An area that includes the discharge port forming positions and that is spaced at least 10 µm or less apart from the discharge port forming positions may be shielded from light. In FIG. 6A, a hatched area including the discharge port forming positions is shielded from light.

The telecentric measurement pattern A 12 has any shape. In consideration of the sake of convenience in calculation of the off-axis telecentric degree, the telecentric measurement pattern A 12 may be rectangular or circular. The telecentric measurement pattern A 12 may have any size, and it can be set at any size in consideration of resolution in the apparatus and development on the layer 9 containing the photosensitive resin material. When the telecentric measurement pattern A is rectangular, for example, its length may be 10 µm to 500 µm and its width may be 10 µm to 500 µm. When the telecentric measurement pattern A is circular, for example, its diameter may be 10 µm to 500 µm.

In terms of precise determination of the off-axis telecentric degree of the discharge port, the telecentric measurement pattern A 12 may be arranged in the vicinity of the discharge port forming position. That is, the shortest distance between the telecentric measurement pattern A 12 and a discharge port nearest the telecentric measurement pattern A 12 may preferably be 1000 µm or less, and it may further preferably be 200 µm or less. Because the area where the discharge ports are to be formed is shielded from light, as previously described, the shortest distance between the telecentric measurement pattern A 12 and the discharge port nearest the telecentric measurement pattern A 12 may preferably be 20 µm or more, and it may further preferably be 50 µm or more.

Next, as illustrated in FIG. 6B, a telecentric measurement pattern B 13 defining the telecentric measurement pattern inner frame 18 and a discharge port pattern 14 are formed simultaneously by exposure using the projection exposing device. At this time, the exposure is performed such that the center position of gravity of the telecentric measurement pattern A 12 formed on the mask in the above-described step and the center position of gravity of the telecentric measurement pattern B 13 formed in this step coincide with each other. The patterning is performed after defocusing from the focus position where the telecentric measurement pattern A 12 is formed. The amount of defocusing may preferably be 1 µm or more, and it may further preferably be 3 µm or more. When the amount of defocusing is 1 µm or more, the amount R of the misalignment between the center position of gravity of the telecentric measurement pattern A 12 and that of the telecentric measurement pattern B 13 is moderately large, and error and variation do not easily affect them. The upper limit of the amount of defocusing is not particularly limited and may be, for example, 50 µm or less.

The focus position of the telecentric measurement pattern A 12 or the telecentric measurement pattern B 13 may be set at the first surface of the layer 9 containing the photosensitive resin material, that is, front surface (top reference). This is because the amount of the misalignment between the forming positions can be obtained by detection of the pattern edges on the first surface of the discharge port forming member in measurement of the off-axis telecentric degree.

Because the off-axis telecentric degree is measured by using the telecentric measurement pattern A 12 and the telecentric measurement pattern B 13, both of the patterns are exposed in the same position on the masks in the projection exposing device. For example, a mask for forming the telecentric measurement pattern A 12 and another mask for forming the discharge port pattern 14 and the telecentric measurement pattern B 13 may be prepared, and exposure may be performed such that the masks are interchanged. With this manner, the masks can be arranged such that the center positions of gravities of the patterns coincide with each other. Accordingly, the center position of gravity of the telecentric measurement pattern A 12 formed on the mask and that of the telecentric measurement pattern B 13 formed on the mask can be easily made to coincide with each other.

The telecentric measurement pattern B 13 may be formed inside the telecentric measurement pattern A 12. The shape of the telecentric measurement pattern B 13 formed on the mask may be similar to the shape of the telecentric measurement pattern A formed on the mask. The size of the telecentric measurement pattern B 13 may preferably be 10% to 90% of the size of the telecentric measurement pattern A 12, and in this case, the off-axis telecentric degree can be precisely calculated. The size of the telecentric measurement pattern B 13 may further preferably be 30% to 70% of the size of the telecentric measurement pattern A 12.

Then, as illustrated in FIG. 6C, the discharge ports 11 and the telecentric measurement pattern 19 are formed by development. After that, the off-axis telecentric degree is determined by the above-described method using the amount of the misalignment of the relative forming positions of the telecentric measurement pattern A 12 and the telecentric measurement pattern B 13 and the amount of defocusing.

A plurality of telecentric measurement patterns 19 may also be formed on the first surface of the discharge port forming member. By arranging the telecentric measurement patterns 19 at specific intervals along the direction in which the discharge ports 11 are disposed, the tendency of distribution of the off-axis telecentric degrees in the rows of the discharge ports 11 can be determined, and thus the landing positions can be estimated in more detail. When the plurality of telecentric measurement patterns 19 are arranged, the intervals of the telecentric measurement patterns 19 may be set at any value. The telecentric measurement patterns 19 may be arranged at intervals of an integral multiple of the intervals of the discharge ports 11.

Second Embodiment

In another embodiment of the present invention, as illustrated in FIGS. 7A to 7D, the telecentric measurement pattern A 12 and the telecentric measurement pattern B 13 may be formed before the discharge port pattern 14 is formed. The conditions in the first embodiment can be appropriately used as the conditions in the manufacture in the present embodiment.

Third Embodiment

In still another embodiment of the present invention, as illustrated in FIGS. 8A to 8D, the telecentric measurement pattern A 12 and the telecentric measurement pattern B 13 may be formed after the discharge port pattern 14 is formed. The conditions in the first embodiment can be appropriately used as the conditions in the manufacture in the present embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-166394, filed Aug. 19, 2014, which is hereby incorporated by reference herein in its entirety.

What is claimed is:

1. A method for manufacturing a liquid discharge head, the method including a step of forming a discharge port pattern at a layer containing a photosensitive resin material by exposure using a projection exposing device, the method comprising:
    a first step of forming a telecentric measurement pattern A by exposure through a mask, the telecentric measurement pattern A being part of a measurement pattern that allows determination of inclination of a principal ray caused by an off-axis telecentric degree occurring in the projection exposing device; and
    a second step of forming a telecentric measurement pattern B by exposure through a mask under an exposure condition defocused from an exposure condition in the first step, the telecentric measurement pattern B being another part of the measurement pattern, which allows the determination of the inclination of the principal ray caused by the off-axis telecentric degree occurring in the projection exposing device,
    wherein the off-axis telecentric degree is determined from an amount of misalignment between relative forming positions of the telecentric measurement pattern A and the telecentric measurement pattern B and an amount of defocusing.

2. The method according to claim 1, wherein in the second step, the discharge port pattern is formed by exposure together with the telecentric measurement pattern B under the exposure condition defocused from the exposure condition in the first step.

3. The method according to claim 1, wherein at least one of the telecentric measurement pattern A and the telecentric measurement pattern B is formed on a first surface of the layer containing the photosensitive resin material.

4. The method according to claim 3, wherein a focus position of the telecentric measurement pattern A or the telecentric measurement pattern B is set on the first surface of the layer containing the photosensitive resin material.

5. The method according to claim 1, wherein the telecentric measurement pattern B is formed inside the telecentric measurement pattern A.

6. The method according to claim 1, wherein a center position of gravity of the telecentric measurement pattern A formed on the mask in the first step and a center position of gravity of the telecentric measurement pattern B formed on the mask in the second step coincide with each other.

7. The method according to claim 1, wherein a shape of the telecentric measurement pattern A formed on the mask is similar to a shape of the telecentric measurement pattern B formed on the mask.

8. The method according to claim 1, wherein a size of the telecentric measurement pattern B is 10% to 90% of a size of the telecentric measurement pattern A.

9. The method according to claim 1, wherein a shortest distance between the telecentric measurement pattern A and a discharge port nearest the telecentric measurement pattern A is 20 μm or more.

10. The method according to claim 1, wherein the amount of defocusing is 1 μm or more.

11. A method for manufacturing an inkjet print head including a plurality of liquid discharge heads, the method comprising:
    a step of manufacturing the plurality of liquid discharge heads by the method according to claim 1; and
    a step of selecting liquid discharge heads having the determined off-axis telecentric degrees close to each other.

* * * * *